(12) United States Patent
Jeong

(10) Patent No.: US 7,561,427 B2
(45) Date of Patent: Jul. 14, 2009

(54) PLASMA DISPLAY PANEL

(75) Inventor: Kwang-Jin Jeong, Suwon-si (KR)

(73) Assignee: Samsung SDI Co., Ltd., Yongin (KR)

( * ) Notice: Subject to any disclaimer, the term of this patent is extended or adjusted under 35 U.S.C. 154(b) by 0 days.

(21) Appl. No.: 11/697,607

(22) Filed: Apr. 6, 2007

(65) Prior Publication Data

US 2007/0236874 A1 Oct. 11, 2007

(30) Foreign Application Priority Data

Apr. 11, 2006 (KR) ........................ 10-2006-0032662

(51) Int. Cl.
*H05K 7/20* (2006.01)
*G06F 1/16* (2006.01)

(52) U.S. Cl. .................... 361/704; 361/690; 361/715

(58) Field of Classification Search ............... 361/690, 361/704, 715, 679.21, 679.22; 165/80.3, 165/104.33, 185; 313/46; 345/60, 905; 348/748; 349/161

See application file for complete search history.

(56) References Cited

U.S. PATENT DOCUMENTS

| | | | |
|---|---|---|---|
| 6,373,702 B2 * | 4/2002 | Oishi et al. | 361/704 |
| 6,744,186 B2 * | 6/2004 | Oishi et al. | 313/46 |
| 7,372,699 B2 * | 5/2008 | Kim | 361/704 |
| 2005/0174301 A1 * | 8/2005 | Kim | 345/3.1 |
| 2005/0194900 A1 * | 9/2005 | Kim et al. | 313/582 |
| 2005/0212426 A1 * | 9/2005 | Ahn | 313/582 |
| 2005/0243106 A1 * | 11/2005 | Bae et al. | 345/679 |
| 2005/0258749 A1 * | 11/2005 | Ahn | 313/582 |
| 2005/0286228 A1 * | 12/2005 | Kim | 361/704 |
| 2006/0077620 A1 * | 4/2006 | Kim | 361/679 |
| 2006/0125365 A1 * | 6/2006 | Kim et al. | 313/46 |
| 2006/0133046 A1 * | 6/2006 | Kim et al. | 361/714 |
| 2006/0187641 A1 * | 8/2006 | Shin | 361/704 |
| 2006/0214583 A1 * | 9/2006 | Jeong | 313/582 |
| 2007/0076396 A1 * | 4/2007 | Kim | 361/796 |

FOREIGN PATENT DOCUMENTS

| KR | 2005-34881 | | 4/2005 |
|---|---|---|---|
| KR | 20050038917 A | * | 4/2005 |

* cited by examiner

*Primary Examiner*—Anatoly Vortman
(74) *Attorney, Agent, or Firm*—Stein McEwen, LLP

(57) ABSTRACT

Provided is a plasma display panel that includes a panel assembly forming an image; a chassis base combined with the panel assembly and separated into pieces; and a plurality of driving circuit units combined with the chassis base and including circuit elements transferring an electrical signal to the panel assembly using signal transfer units, which more effectively transfers heat generated from the panel assembly or the signal transfer units, thereby improving a thermal dissipation function.

14 Claims, 5 Drawing Sheets

PLASMA DISPLAY PANEL

CROSS-REFERENCE TO RELATED APPLICATIONS

This application claims the benefit of Korean Patent Application No. 2006-32662, filed Apr. 11, 2006, in the Korean Intellectual Property Office, the disclosure of which is incorporated herein in its entirety by reference.

BACKGROUND OF THE INVENTION

1. Field of the Invention

Aspects of the present invention relate to a plasma display panel, and more particularly, to a plasma display panel that effectively dissipates heat generated from a panel assembly or signal transfer units when the plasma display panel is driven.

2. Description of the Related Art

Conventionally, plasma display panels are flat display devices that display desired numbers, letters, or graphics by exciting a discharge gas, which is sealed between two substrates on which a plurality of electrodes are formed, by applying a predetermined discharge voltage to the discharge gas. The discharge gas in the discharge cells emits light at an addressing point where two electrodes cross each other. A properly applied pulse voltage causes the discharge voltage to excite the discharge gas.

FIG. 1 is a cross-sectional view of a conventional plasma display panel 100. The plasma display panel 100 comprises a panel assembly 110, a chassis base 120 formed in the rear of the panel assembly 110, a filter 130 formed in the front of the panel assembly 110, and a case 140 to house the panel assembly 110, the chassis base 120, and the filter 130.

The plasma display panel 100 dissipates heat of the panel assembly 110 using an adhesive member 150 disposed between the panel assembly 110 and the chassis base 120. The chassis base 120 can be combined to the panel assembly 110, which equally provides heat dissipation throughout all regions of the panel assembly 110.

However, heat from an element of a driving circuit unit coupled to the chassis base 120 is conducted via the adhesive member 150 to the panel assembly 110 and increases temperature of the panel assembly 110. The heat conducted to the panel assembly may cause a malfunction thereof. Therefore, the panel assembly 110 needs to be insulated from the heat generated by the driving circuit units coupled to the chassis base.

Also, the voltage applied to the discharge electrodes of the panel assembly 110 is a single-scanned voltage, which increases the amount of heat generated by driving ICs of the signal transfer units that transfer an electrical signal of the driving circuit unit. Such heat may be transferred to the panel assembly resulting in malfunction. Therefore, it is necessary to quickly dissipate heat generated from the driving IC to effectively cool the plasma display panel 100.

SUMMARY OF THE INVENTION

Aspects of the present invention provide a plasma display panel with an improved structure in which heat generated from a panel assembly or signal transfer units is quickly dissipated to the outside of the plasma display panel.

According to an aspect of the present invention, there is provided a plasma display panel comprising: a panel assembly forming an image; a chassis base combined with the panel assembly and separated into pieces; and a plurality of driving circuit units combined with the chassis base and including circuit elements transferring an electrical signal to the panel assembly using signal transfer units.

The chassis base may comprise a first chassis base spaced apart from the panel assembly and a second chassis base connected to the first chassis base and coupled to the panel assembly.

The second chassis base may be combined to the outer surface of the panel assembly using an adhesive member, and be bent more than one times to form a receipt unit in which an end of the first chassis base is disposed.

The first chassis base may be coupled to the receipt unit using a combination unit.

A thermal dissipating sheet may be adhered to the surface of the panel assembly facing the chassis base.

Discharge electrodes disposed in the panel assembly may be single-scan driven in a region where the second chassis base is formed.

A cover plate may be combined to the upper part of the second chassis base so as to protect the signal transfer units.

According aspects of the present invention, a chassis for a panel assembly of a display apparatus is provided, including a first chassis base; and a second chassis base, wherein the first chassis base and the second chassis base couple to support the panel assembly and provide a space between the panel assembly and the first chassis base.

According to aspects of the present invention, a plasma display apparatus is provided, including the chassis according to any of the above-described aspects; and a case having openings for air flow, wherein the case houses the chassis and the panel assembly.

According to aspects of the present invention, a plasma display panel is provided, including a panel assembly; a chassis, which includes a first chassis base; and a second chassis base, wherein the first chassis base and the second chassis base couple to support the panel assembly and provide a space between the panel assembly and the first chassis base; and a case to house the panel assembly and the chassis, wherein the chassis and the panel assembly are disposed in the case.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
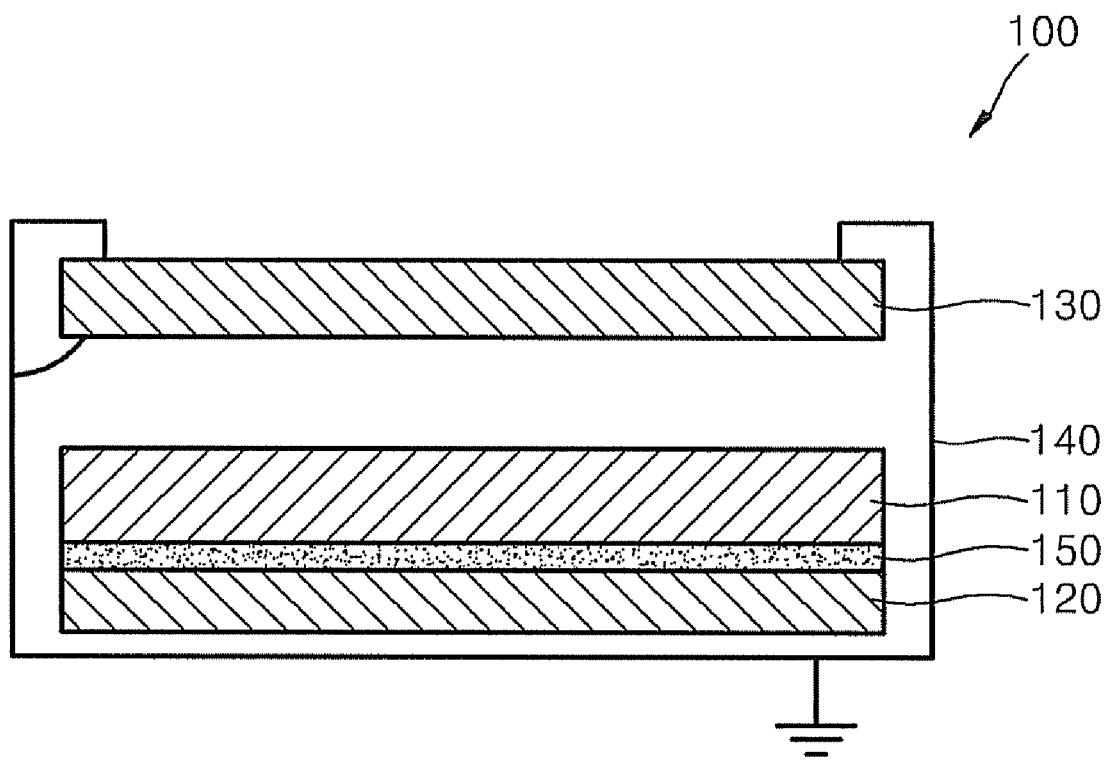
FIG. 1 is a cross-sectional view of a conventional plasma display panel.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
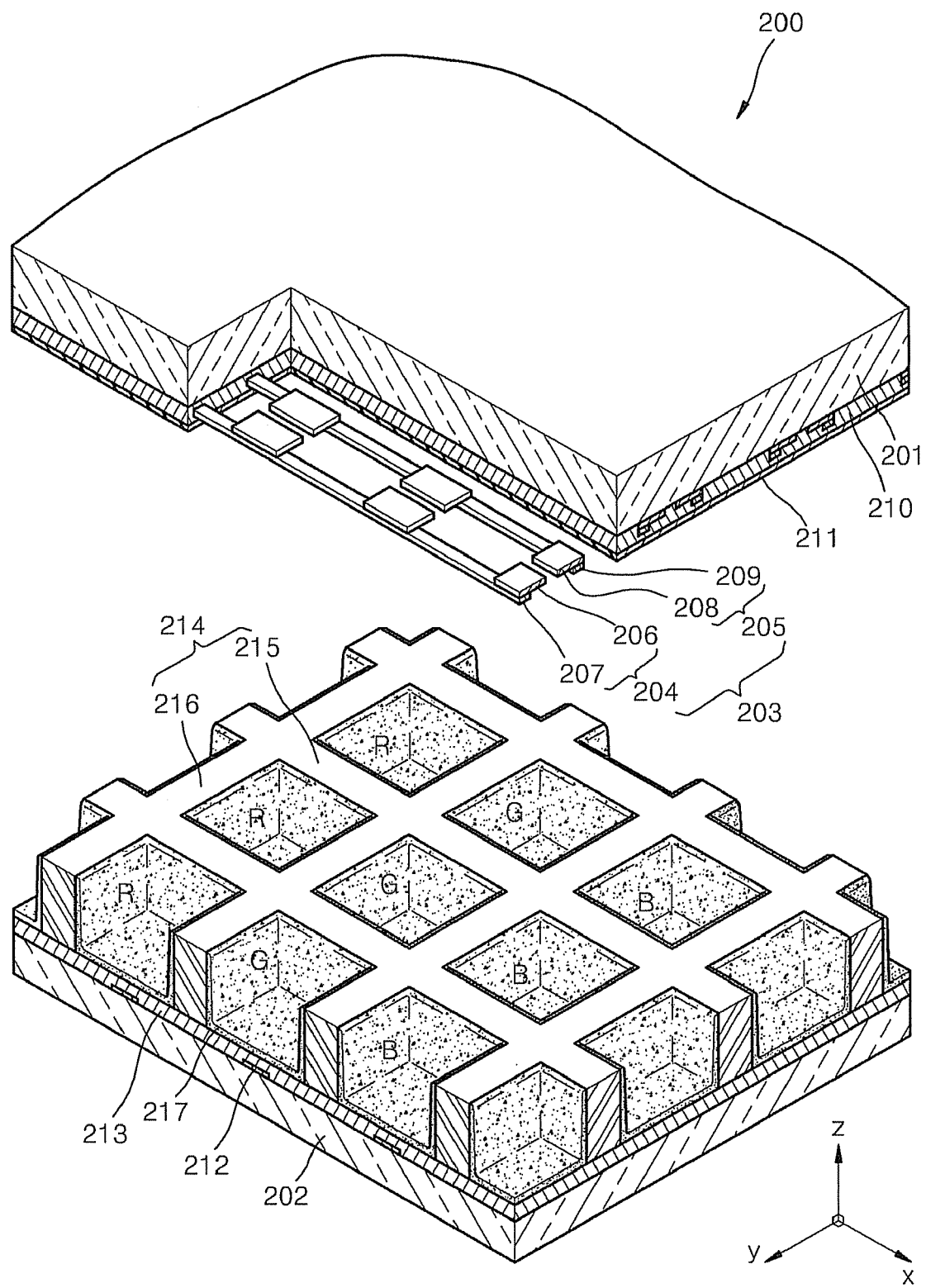
FIG. 2 is a partially cutaway exploded perspective view of a panel assembly according to aspects of the present invention.

FIG. 2 is a partially cutaway exploded perspective view of a panel assembly 200 according to aspects of the present invention. Referring to FIG. 2, the panel assembly 200 includes a first substrate 201 and a second substrate 202 disposed parallel to the first substrate 201. The first substrate 201 and the second substrate 202 form sealed discharge spaces by a frit glass (not shown) that is coated on facing inner edges thereof.

The first substrate 201 is a transparent substrate such as soda lime glass, a semi-transparent substrate, a reflective substrate, or a colored substrate.

A plurality of pairs of sustain electrodes 203 are disposed on a side of the first substrate 201 that faces the second substrate 202, or the sustain electrodes 203 are disposed on the first substrate 201 between the first substrate 201 and the second substrate 202. Each of the pairs of sustain electrodes 203 includes an X electrode 204 and a Y electrode 205, meaning that one of a pair of the sustain electrodes 203 is an X electrode 204 and the other of that pair of the sustain electrodes 203 is a Y electrode 205. One of the X electrodes 204 and one of the Y electrodes 205 is disposed in each discharge cell. So, each discharge cell has an associated pair of sustain electrodes 203.

The X electrode 204 includes a first transparent electrode 206 disposed in each discharge cell of the panel assembly 200 and a first bus electrode 207 that electrically connects the first transparent electrode 206 to an X driving unit (not shown). The X electrodes 204 are disposed in an X direction of the panel assembly 200. The Y electrode 205 includes a second transparent electrode 208 disposed in each discharge cell of the panel assembly 200 and a second bus electrode 209 that electrically connects the second transparent electrode 208 to a Y driving unit (not shown). The Y electrodes are disposed in the X direction of the panel assembly 200.

The first transparent electrode 206 and the second transparent electrode 208 are independently disposed in each discharge cell and have tetragonal cross-sections. The first bus electrode 207 and the second bus electrode 209 are disposed to face each other along edges of each discharge cell, and are stripe-typed across adjacent discharge cells in the X direction of the panel assembly 200. However, the first and the second transparent electrodes 206 and 208 are not limited thereto. The first and the second transparent electrodes 206 and 208 may be circular, ovular The first transparent electrode 206 and the second transparent electrode 208 are formed of a transparent conductive film such as an ITO film. The first bus electrode 207 and the second bus electrode 209 are formed of an excellent conductive silver paste or metal such as Cr—Cu—Cr.

The pair of sustain discharge electrodes 203 are covered by a first dielectric layer 210, which is formed of a transparent dielectric, such as a high dielectric material of PbO—$B_2O_3$—$SiO_2$.

A protective layer 211 formed of magnesium oxide MgO is formed on the surface of the first dielectric layer 210 and increases an amount of discharged secondary electrons. The protective layer 211 is deposited on the surface of the first dielectric layer 210.

The second substrate 202 is a transparent substrate, a semi-transparent substrate, a reflective substrate, or a colored substrate. Address electrodes 212 are disposed on the inner surface of the second substrate 202 and crosses the X electrodes 204 and the Y electrodes 205. The address electrodes 212 are formed on the surface of the second substrate 202 that faces the first substrate 201 or are disposed on the surface of the second substrate 202 between the first substrate 201 and the second substrate 202.

The address electrodes 212 extend across adjacent discharge cells in a Y direction of the panel assembly 200 and are stripe-typed. The address electrodes 212 are formed of excellent conductive metal such as silver paste.

The address electrodes 212 are covered by a second dielectric layer 213. The second dielectric layer 213 is formed of the same high dielectric material as the first dielectric layer 210.

Barrier ribs 214 are disposed between the first substrate 201 and the second substrate 202. The barrier ribs 214 define each discharge cell to prevent cross-talk between adjacent discharge cells.

The barrier ribs 214 include first barrier ribs 215 disposed in the X direction of the panel assembly 200, and second barrier ribs 216 disposed in the Y direction of the panel assembly 200. The first barrier ribs 215 are integrally formed in a direction opposing the direction in which the second barrier ribs 216 extend, resulting in matrix-type discharge spaces.

The barrier ribs 214 are not limited thereto. The discharge spaces defined by the barrier ribs 214 can have any shape, such as a polygonal shape, a circle shape, or an oval shape.

A discharge gas such as Ne—Xe or He—Xe is sealed in the discharge cells partitioned by the combination of the first substrate 201, the second substrate 202, and the barrier ribs 214.

Phosphor layers 217 that emit a plurality of colors are formed in discharge cells. The phosphor layers 217 emit visible light when excited by ultraviolet light generated from the discharge gas. The phosphor layers 217 can be coated on any region of discharge cells and are formed on the upper portion of the second dielectric layer 213 and the sidewalls of the barrier ribs 214.

The phosphor layers 217 include red, green, and blue colors respectively within each discharge cell. The phosphor layer 217 that emits red light may be formed of $(Y,Gd)BO_3$: $Eu^{+3}$, the phosphor layer 217 that emits green light may be formed of $Zn_2SiO_4$:$Mn^{2+}$, and the phosphor layer 217 that emits blue light may be formed of $BaMgAl_{10}O_{17}$:$Eu^{2+}$.

Figure 3:
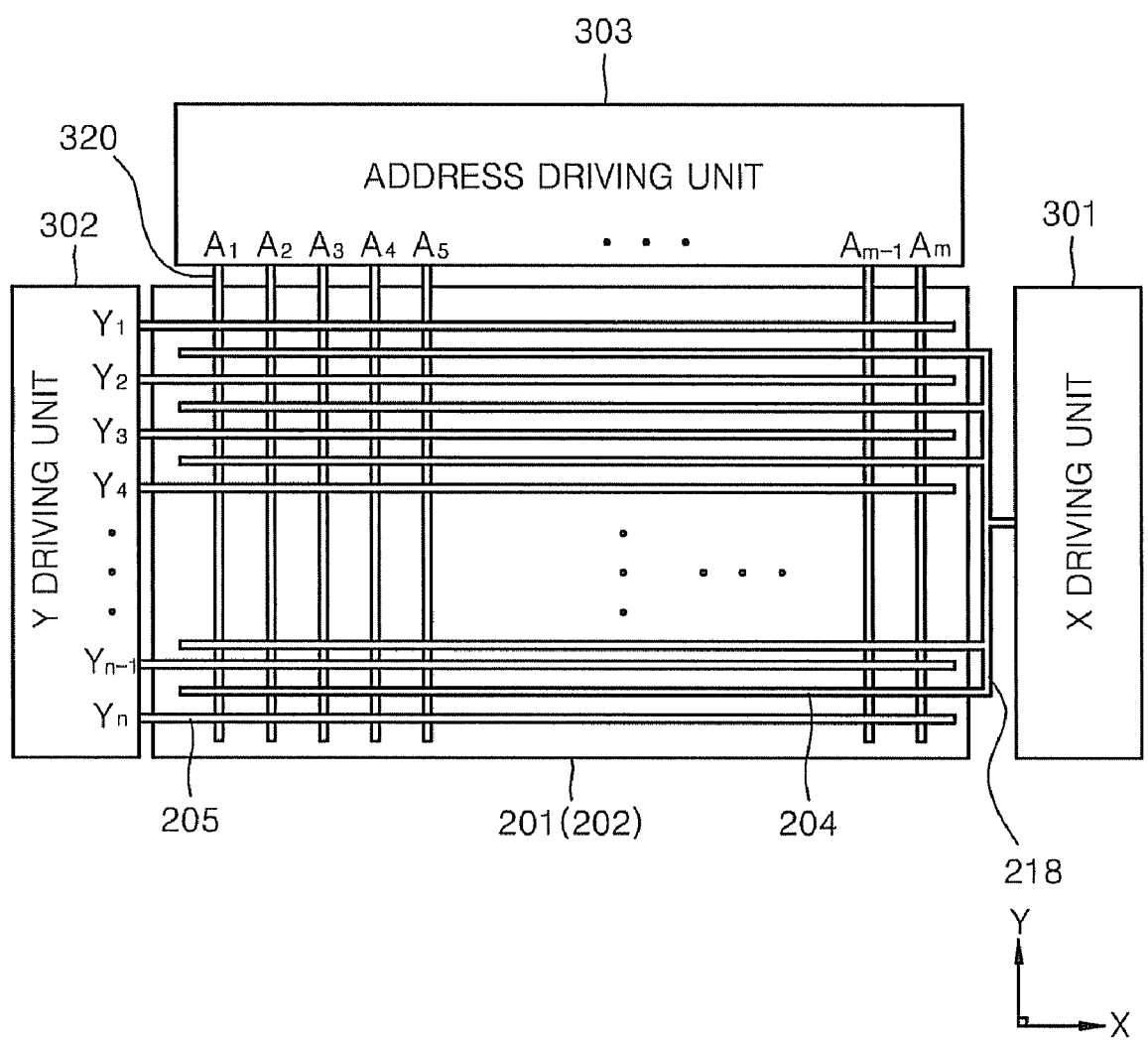
FIG. 3 is a diagram of a layout of discharge electrodes illustrated in FIG. 2.

FIG. 3 is a diagram of a layout of the discharge electrodes illustrated in FIG. 2. Referring to FIG. 3, the X electrodes 204 are integrally connected to a connection bar 218 in a non-display area of the panel assembly 200 so that the same discharge voltage can be applied to each of the X electrodes 204 during a sustain discharge period. The X electrodes 204 process an X driving control signal generated by the X driving unit 301 and are electrically connected thereto in order to apply a common voltage from the X electrodes 204 to the discharge cells.

The Y electrodes 205 are independently separated so that a different discharge voltage is applied to each of the Y electrodes 205. The Y electrodes 205 process a Y driving control signal generated by the Y driving unit 302 and are electrically connected thereto in order to apply a scan voltage to the discharge cells.

The address electrodes 320 process an address driving control signal generated by the address driving unit 303 and are electrically connected thereto in order to generate a display data signal having an address voltage.

The address driving unit 303 processes an address driving control signal to generate the display data signal having the address voltage and applies the display data signal to the address electrodes 320. The address electrodes 320 are single-scan driven.

Figure 4:
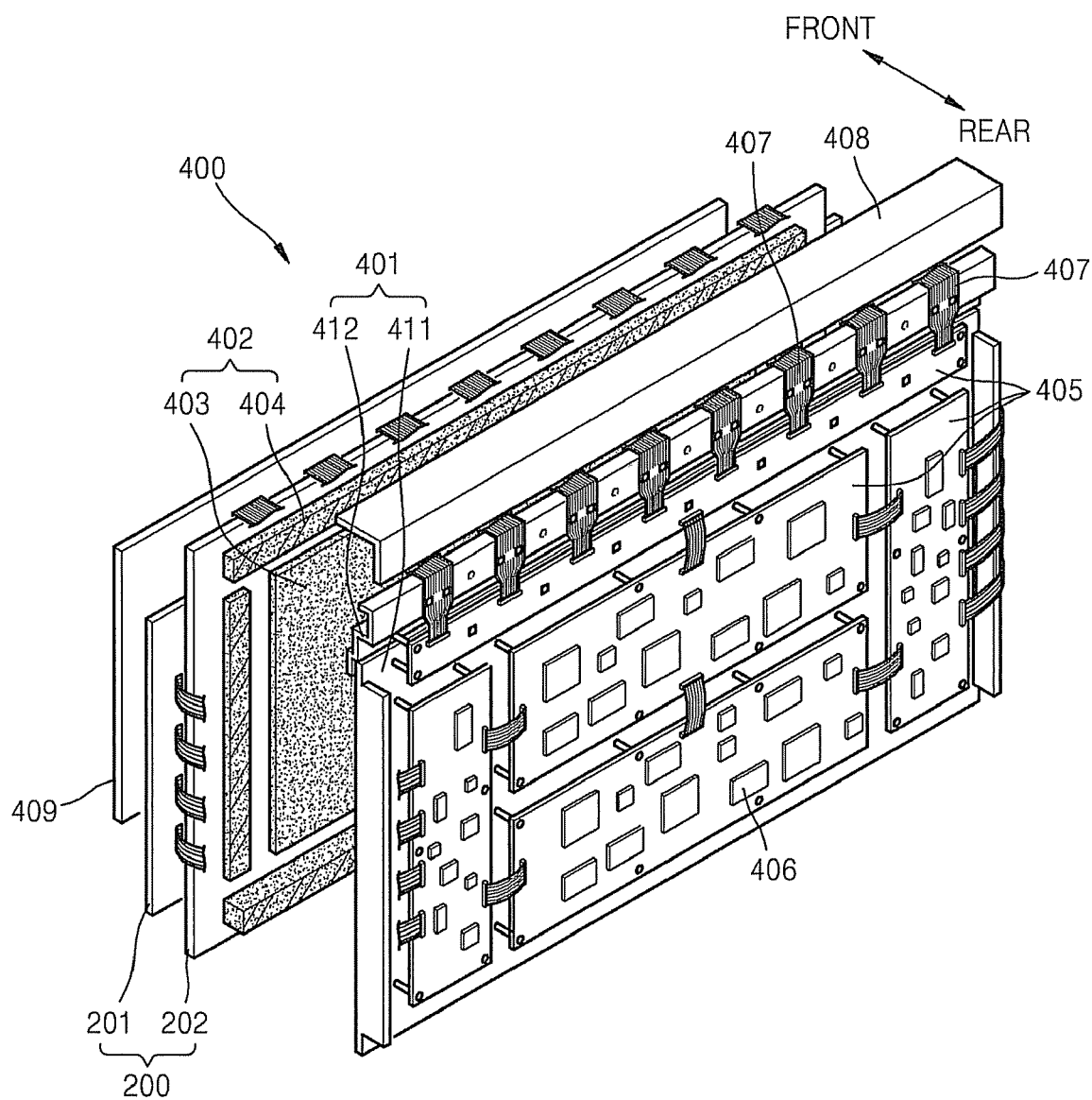
FIG. 4 is an exploded perspective view of a plasma display panel to which the panel assembly illustrated in FIG. 2 is applied according to aspects of the present invention.
Figure 5:
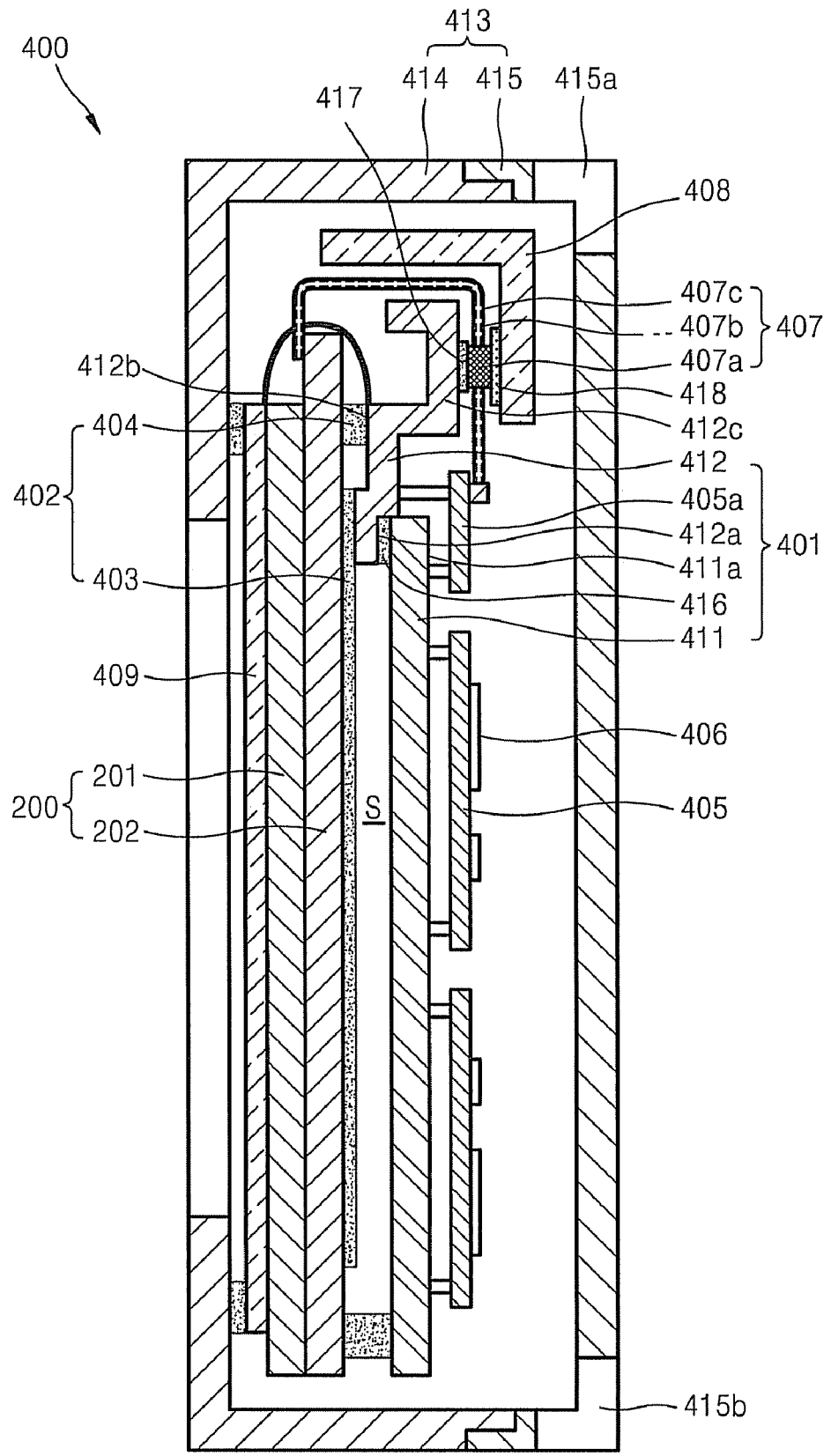
FIG. 5 is a cross-sectional view taken along the line I-I of the plasma display panel of FIG. 4, according to aspects of the present invention.

FIG. 4 is an exploded perspective view of a plasma display panel 400 in which the panel assembly 200 illustrated in FIG. 2 is disposed according to aspects of the present invention. FIG. 5 is a cross-sectional view taken along the line I-I of the plasma display panel of FIG. 4, according to aspects of the present invention.

Referring to FIGS. 4 and 5, the plasma display panel 400 includes the first substrate 201 and the panel assembly 200 which comprises the first substrate 201 and the second substrate 202.

A chassis base 401 is coupled to the rear of the panel assembly 200. The panel assembly 200 is coupled to the chassis base 401 via an adhesive member 402. The adhesive member 402 includes a thermal conductive sheet 403 and a double-sided tape 404. The conductive sheet 402 is attached centrally to the rear of the second substrate 202 and dissipates heat generated from the panel assembly 200. The double-sided tape 404 attaches to the rear edge of the second substrate 202 and couples together the chassis base 401 and the panel assembly 200.

A plurality of driving circuit units 405 are formed on the rear of the chassis base 401. A plurality of circuit elements 406 is mounted in the driving circuit units 405. First ends of signal transfer units 407, such as a flexible printed cable (FPC), are electrically connected to the circuit elements 406. Second ends of the signal transfer units 407 are electrically connected to each electrode terminal of the panel assembly 200. Therefore, electrical signals can be mutually transferred between the panel assembly 200 and the driving circuit units 405. Also, a cover plate 408 is formed at an upper end of the chassis base 401 in order to protect the signal transfer units 407.

A filter 409 is formed in the front of the panel assembly 200 in order to prevent electromagnetic waves, ultraviolet rays, and neon luminescence generated from the panel assembly 200. The filter 409 also prevents reflection of external light.

The filter 409 includes an electromagnetic wave shielding layer that effectively prevents electromagnetic waves generated when the panel assembly 200 is driven. The filter 409 also includes a selective wavelength absorptive film that shields neon luminescence and unnecessary luminescence of forward-directed infrared light caused by plasma of inactive gas used for screen luminescence. And, the filter 409 includes a reflection preventive film that prevents visible recognition of the displayed images from decreasing due to the reflection of the external light. The filter 409 may be wholly attached to the first substrate 201.

The panel assembly 200, the chassis base 401, the driving circuit units 405, and the filter 409 are housed in a case 413. The case 413 includes a front case 414 formed in the front of the filter 409, and a back cover 415 formed in the rear of the driving circuit units 405. The front case 414 and the back cover 415 couple together to house the panel assembly 200, the chassis base 401, the driving circuit units 405, and the filter 409.

The chassis base 401 is separated into pieces to support the panel assembly 200.

In more detail, the chassis base 401 includes a first chassis base 411 and a second chassis base 412 coupled to the first chassis base 411.

The first chassis base 411 is spaced apart or separated from the panel assembly 200 by a predetermined gap, space S. The first chassis base 411 is flat and is about the same size as the panel assembly 200, meaning that the first chassis base 411 has about the same height and width as the panel assembly 200. The first chassis base 411 can be formed of aluminum, steel, combination materials, non-metal, and other various materials. The plurality of driving circuit units 405 are formed on the rear of the first chassis base 411. The first chassis base 411 may include cooling fins or other heat dissipation structures.

The first chassis base 411 does not contact the second substrate 202 using an adhesive member but is spaced therefrom by the predetermined gap, space S. The space S is formed between the second substrate 202 and the first chassis base 411. And, the space S provides an exhaust path that dissipates heat generated from the panel assembly 200 and a shielding space that prevents heat generated from the elements 406 of the driving circuit units 405 from being conducted to the chassis base 411. The space S also acts as a flow channel for the movement of air to cool the panel assembly 200.

The second chassis base 412 is connected to the upper part 411a of the first chassis base 411 so that the first chassis base 411 can be spaced apart from the second substrate 202 by the predetermined gap, space S. The second chassis base 412 is formed at a side of the panel assembly where the single-scan driven address electrodes 212 (FIG. 3) are connected to the address driving unit 303. The second chassis base 412 is disposed in a length direction of the first chassis base 411.

A first end of the second chassis base 412 is bent more than one time to form a receipt unit 412a. The upper part 411a of the first chassis base 411 is disposed in a length direction of the receipt unit 412a meaning that the receipt unit 412a is disposed along the entire upper part 411a of the first chassis base 411 between the first chassis base 411 and the second substrate 202. The second chassis base 412 may have about the width as the first chassis base 411 and the panel assembly 200. Also, the second chassis base 412 may have cooling fins or other heat dissipation structures.

A combination unit 416 that combines the first chassis base 411 with the second chassis base 412 can be disposed between the receipt unit 412a of the second chassis base 412 and the upper part 411a of the first chassis base 411.

The combination unit 416 is formed of any one selected from an adhesive tape, a screw method, a rivet method, and a laser method. The combination unit 416 may be formed of a thermal conductive material in order to conduct heat of the first chassis base 411 and the second chassis base 412.

An opposite surface 412b of the second chassis base 412 in which the receipt unit 412a is formed is connected to the second substrate 201 using the adhesive member 404, which may be a double-sided tape. The space S is formed between the first chassis base 411 and the second substrate 202 due to the thicknesses of the receipt unit 412a of the second chassis base 412, the adhesive member 404 disposed between the second substrate 202 and the second chassis base 412, and the combination unit 416.

Accordingly, a thermal conductive sheet 403 attached to a surface of the second substrate 202 that faces the first chassis base 411 but does not contact the first chassis base 411. As such, the thermal conductive sheet 403 is exposed to the space S. Heat generated from driving the panel assembly 200 is dissipated to the space S through the thermal conductive sheet 403. The thermal conductive sheet 403 can be formed of graphite.

A second end 412c of the second chassis base 412 is bent to adhere to the signal transfer units 407. In detail, the second end 412c is bent at a 90 degree more than one time. The signal transfer units 407 are adhered to the outside of the second end 412c or the signal transfer units 407 are adhered to a side of the second end 412c that faces the back cover 415.

The signal transfer units 407 include a plurality of driving ICs 407a, a plurality of leads 407b electrically connected to the driving ICs 407a, and a film 407c that is flexible enough to cover the leads 407b. The signal transfer units 407 are disposed between the second end 412c of the second chassis base 412 and the cover plate 408. The cover plate 408 protects the signal transfer units 407 from an external shock and dissipates heat generated by the signal transfer units 407.

The driving ICs 407a are disposed between the back surface of the second end 412c of the second chassis base 412 and the front surface of the cover plate 408. A thermal grease 417 is coated between the driving ICs 407a and the outer surface of the second end 412c. The outer surface of the second end 412c is the surface of the second chassis base 412 that is opposite the surface of the second chassis base 412 that faces the panel assembly. A thermal dissipation sheet 418 is disposed between the driving ICs 407a and the cover plate 408.

A first end of the film 407c is electrically connected to each electrode terminal of the panel assembly 200. The second end of the film 407c extends in an opposite direction and is electrically connected to the circuit elements 406 mounted in one 405a of the driving circuit units 405. To electrically connect the electrodes of the panel assembly 200 to the circuit elements 406, the film 407c passes between the second end 412c of the second chassis base 412 and the cover plate 408. The driving circuit units 405a connected to the film 407c are combined with the first chassis base 411 and the second chassis base 412 but are not limited thereto.

The film 407c is bent more than one time in order to connect to each electrode terminal of the panel assembly 200. The first end of the film 407c is bent two times to be electrically connected to electrodes of the panel assembly 200. The second end of the film 407c is not curved but rectilinearly extends so as to connect to the circuit element 406.

The plasma display panel having the above configuration cools heat generated from the panel assembly 200 by dissipating the heat to the space S through the thermal conductive sheet 403. Air flows from a lower to an upper part of the case 413 by a convection current. The air flows in to the case 413 through lower opening 415b, up through the case 413 and the space S via a convection current, and then out of the case 413 through the upper opening 415a.

The space S formed between the second substrate 202 and the first chassis base 411 prevents heat generated from the circuit elements 406 of the driving circuit units 405 from being conducted to the panel assembly 200.

Heat generated from the driving ICs 407a is dissipated by the cover plate 408 via the heat dissipating sheet 418 and the second chassis base 412 via the thermal grease 417.

Aspects of the present invention having the above configuration provide the following and/or other advantages.

First, a chassis base is separated into pieces to be combined with a panel assembly, which more effectively transfers heat generated from the panel assembly or signal transfer units, thereby improving thermal dissipation.

Second, the chassis base is spaced from the panel assembly to form a space, thereby preventing heat generated from circuit elements of driving circuit units from being transferred to the panel assembly.

Third, the heat generated from the panel assembly is exchanged with air from outside of the display panel and flows through the space so that the heat is quickly dissipated.

Fourth, a thermal conductive sheet is adhered to the surface of the panel assembly facing the chassis base, thereby easily emitting the heat generated from the panel assembly.

Fifth, the ends of one of the separations of the chassis base are bent, which allows for the signal transfer units to be easily adhered to the chassis base and electrically connect the panel assembly to the circuit elements.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A plasma display panel comprising:
a panel assembly to form an image;
a chassis base combined with the panel assembly and separated into pieces, the chassis base comprising:
   a first chassis base spaced apart from the panel assembly; and
   a second chassis base connected to the first chassis base and coupled with the panel assembly, the second chassis base being coupled to a rear edge of the panel assembly between the panel assembly and the first chassis base using an adhesive member;
a thermal conductive sheet disposed on a surface of the panel assembly facing the chassis base;
a plurality of driving circuit units combined with the chassis base;
circuit elements disposed on the plurality of driving circuit units; and
signal transfer units,
wherein the circuit elements transfer an electrical signal to the panel assembly via the signal transfer units, and
wherein a space that dissipates heat generated from the panel assembly is formed between the first chassis base and the thermal conductive sheet,
wherein the second chassis base is coupled to the surface of the panel assembly that faces the chassis base, and the second chassis base is bent at least twice to form a receipt unit in which an end of the first chassis base is disposed.

2. The plasma display panel of claim 1, wherein the first chassis base is substantially flat and is about a same size as the panel assembly.

3. The plasma display panel of claim 1, wherein the first chassis base is coupled to the receipt unit using a combination unit.

4. The plasma display panel of claim 3, wherein the combination unit is any one selected from an adhesive tape, a screw method, a rivet method, and a laser method.

5. The plasma display panel of claim 1, wherein the signal transfer units comprise a plurality of driving ICs, a plurality of leads electrically connected to the driving ICs, and a film that is flexible enough to cover the leads.

6. The plasma display panel of claim 5, wherein the driving ICs are adhered to an end of the second chassis base on a surface of the second chassis base that is opposite a surface of the second chassis base that faces the panel assembly.

7. The plasma display panel of claim 1, wherein each one of the driving circuit units to which the signal transfer units are connected is coupled to both the first chassis base and the second chassis base.

8. The plasma display panel of claim 1, wherein the thermal dissipating sheet is adhered to the surface of the panel assembly that faces the chassis base.

9. The plasma display panel of claim 1, wherein discharge electrodes disposed in the panel assembly are single-scan driven by driving circuit units arranged in a region where the second chassis base is formed.

10. The plasma display panel of claim 1, wherein a cover plate is combined to an upper part of the second chassis base so as to protect the signal transfer units.

11. The plasma display panel of claim 1, wherein the first chassis base and the second chassis base are connected to provide the space between the thermal conductive sheet and the first chassis base, and the space provides a flow channel for air between the panel assembly and the first chassis base.

12. The plasma display panel of claim 1, wherein the first chassis base further comprises cooling fins.

13. The plasma display panel of claim 1, wherein the second chassis base further comprises cooling fins.

14. The plasma display panel of claim 1, further comprising an adhesive member to couple the panel assembly and the receipt unit of the second chassis base.

* * * * *

UNITED STATES PATENT AND TRADEMARK OFFICE
CERTIFICATE OF CORRECTION

PATENT NO.         : 7,561,427 B2                                  Page 1 of 1
APPLICATION NO.    : 11/697607
DATED              : July 14, 2009
INVENTOR(S)        : Kwang-Jin Jeong It is certified that error appears in the above-identified patent and that said Letters Patent is hereby corrected as shown below:

Column 8, line 53, change "1Cs" to --ICs--.

Signed and Sealed this

First Day of September, 2009

David J. Kappos
*Director of the United States Patent and Trademark Office*